(12) United States Patent
Boehm et al.

(10) Patent No.: US 9,893,232 B2
(45) Date of Patent: Feb. 13, 2018

(54) METHOD FOR PRODUCING AN OPTOELECTRONIC SEMICONDUCTOR COMPONENT AND OPTOELECTRONIC SEMICONDUCTOR COMPONENT

(71) Applicants: OSRAM Opto Semiconductors GmbH, Regensburg (DE); OSRAM GmbH, Munich (DE)

(72) Inventors: Bernd Boehm, Obertraubling (DE); Daniel Zaspel, Regenstauf (DE); Stefan Hartauer, Wolfsegg (DE); Bjoern Hoxhold, Sinzing (DE)

(73) Assignees: OSRAM Opto Semiconductors GmbH, Regensburg (DE); OSRAM GmbH, München (DE)

( * ) Notice: Subject to any disclaimer, the term of this patent is extended or adjusted under 35 U.S.C. 154(b) by 0 days.

(21) Appl. No.: 15/514,489

(22) PCT Filed: Sep. 24, 2015

(86) PCT No.: PCT/EP2015/072013
§ 371 (c)(1),
(2) Date: Mar. 24, 2017

(87) PCT Pub. No.: WO2016/050608
PCT Pub. Date: Apr. 7, 2016

(65) Prior Publication Data
US 2017/0288091 A1     Oct. 5, 2017

(30) Foreign Application Priority Data

Sep. 30, 2014  (DE) .................. 10 2014 114 188

(51) Int. Cl.
*H01L 33/00*     (2010.01)
(52) U.S. Cl.
CPC ............................. *H01L 33/0095* (2013.01)

(58) Field of Classification Search
None
See application file for complete search history.

(56) References Cited

U.S. PATENT DOCUMENTS

2004/0195576 A1   10/2004  Watanabe et al.
2006/0256685 A1*  11/2006  Wang ..................... B41J 2/46
                                                     369/47.53
(Continued)

FOREIGN PATENT DOCUMENTS

DE    102010046257 A1    12/2008
DE    102009036621 A1     2/2011
(Continued)

OTHER PUBLICATIONS

Loechel. B., "Thick-Layer Resists for Surface Micromachining", Journal of Micromechanics & Microengineering 10, 2000, pp. 108-115.

*Primary Examiner* — Charles Garber
*Assistant Examiner* — Alia Sabur
(74) *Attorney, Agent, or Firm* — McDermott Will & Emery LLP

(57) ABSTRACT

The invention provides an optoelectronic semiconductor component and a method for producing an optoelectronic semiconductor component (10), comprising the following steps: A) arranging at least one semiconductor chip (2) on a carrier (1), B) applying an electrically insulating photoresist (3) to a top side (1a) of the carrier (1) and to the semiconductor chip (2), C) curing the photoresist (3) with a baking step, D) patterning the photoresist (3) by exposure, F) developing the photoresist (3), wherein the photoresist (3) is removed at least from a radiation penetration surface (2b) of the semiconductor chip (2), G) again curing the photoresist (3) with a baking step, and H) applying an electrically conductive contact layer (4) to the photoresist (3), wherein the electrically conductive contact layer (4) is in places at a (Continued)

Figure 1:
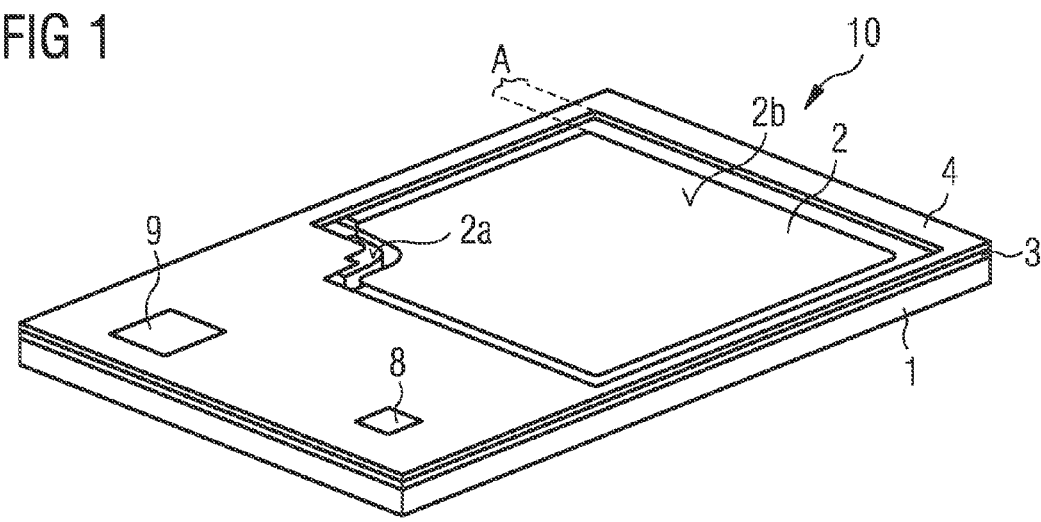

distance (A) from a marginal surface (3a) of the photoresist (3) which faces towards the semiconductor chip (2), wherein the marginal surface (3a) facing towards the semiconductor chip (2) is exposed in places.

17 Claims, 2 Drawing Sheets

(56) References Cited

U.S. PATENT DOCUMENTS

| | | | | |
|---|---|---|---|---|
| 2011/0086447 | A1* | 4/2011 | Herrmann | H01L 25/0753 438/27 |
| 2011/0272810 | A1* | 11/2011 | Clevenger | H01L 21/02126 257/741 |
| 2012/0119233 | A1* | 5/2012 | Weidner | H01L 33/486 257/88 |
| 2013/0214323 | A1* | 8/2013 | Weidner | H01L 33/0095 257/99 |

FOREIGN PATENT DOCUMENTS

| | | |
|---|---|---|
| DE | 102010034565 A1 | 2/2012 |
| KR | 20080108885 A | 12/2008 |
| WO | 2009096619 A1 | 8/2009 |

\* cited by examiner

METHOD FOR PRODUCING AN OPTOELECTRONIC SEMICONDUCTOR COMPONENT AND OPTOELECTRONIC SEMICONDUCTOR COMPONENT

The invention relates to a method for producing an optoelectronic semiconductor component and to an optoelectronic semiconductor component.

This patent application claims the priority of the German patent application 10 2014 114 188.1, the disclosure content of which is incorporated herein by reference.

In optoelectronic semiconductor components which emit UV light or light in the blue wavelength range in operation, insulators, passivations and other constituents of the semiconductor component are subject to enormous stress. Common passivations for semiconductor chips and insulator materials for marginal areas of the semiconductor chips exhibit signs of ageing over time, e.g. in the form of discolorations, brittleness and reduced temperature stability or a limitation of the insulating property.

The use of photoresists as dielectric passivations or insulators that remain in a semiconductor component permanently after it has been completed is not common in the conventional production of optoelectronic semiconductor components. Additional curing processes on photoresists bring about advantageous properties of the photoresist in terms of resistance to exposure to energetic radiation and high temperatures during operation of the optoelectronic semiconductor component.

The invention is based on the object of providing a method for producing an optoelectronic semiconductor component and an optoelectronic semiconductor component, which is distinguished by high UV and temperature stability and a long lifespan.

This object is achieved by a method and a product according to the independent claims. Advantageous embodiments and developments of the invention are provided by the dependent claims.

In a method for producing an optoelectronic semiconductor component, a carrier is prepared in a method step A). At least one semiconductor chip is furthermore arranged on the carrier in method step A).

The arranging of the semiconductor chip on the carrier takes place e.g. such that the semiconductor chip is surrounded by the carrier material. This can advantageously be an encapsulating material, which forms the carrier after at least partial lateral embedding of the semiconductor chip. After encapsulation of the semiconductor chip, the encapsulating material is advantageously cured and thus forms the carrier. Alternatively, the semiconductor chip can also be arranged on the carrier.

In the method for producing an optoelectronic semiconductor component, in a further method step B) an electrically insulating photoresist is applied on a top side of the carrier and on to the semiconductor chip.

The application of a photoresist advantageously takes place over the entire surface of the carrier and of the semiconductor chip, e.g. by means of spin coating. As a result, a readily performed, uniform coating with the photoresist is achieved. The spin coating takes place e.g. at a rotational speed of 1500 rpm. In particular, a film thickness of the photoresist of up to 15 µm can be achieved in this way.

In a further method step C), the photoresist is cured with a baking step.

By means of a baking step (bake), the photoresist is heated to a high temperature and thus stabilized, since moisture and residues, e.g. of solvents, are partially desorbed from the photoresist. The baking step advantageously takes place for a period of (180±2) s and at a temperature of the photoresist of (110±5)° C. (so-called "soft bake"). The selected duration of the baking step here is dependent on the thickness of the photoresist. For example, the duration used for a thinner or thicker photoresist can also be less than or greater than 180 s. Furthermore, the selected temperature is dependent on the format of the semiconductor chip and/or of the carrier. For example, for a higher or lower thermal conductivity of the semiconductor chip and/or of the carrier, the temperature can also be lower than or higher than 110° C.

In a further method step D) of the method for producing an optoelectronic semiconductor component, the photoresist is patterned by exposure.

The exposure of the photoresist can take place here by means of a mask. Advantageously, various forms of exposure can be employed here, such as for instance proximity exposure or projection exposure or other forms of exposure. The exposure can advantageously take place with an illuminance of e.g. 200 mJ/cm$^2$ as broadband exposure. To achieve this, it is advantageous to position the mask at a distance of 100 µm above the photoresist or to place the mask directly on to the photoresist. The parameter values for the illuminance and/or the distance used here are dependent on the exposure system used. Other methods of exposure are also possible. Advantageously, the photoresist can be of transparent design in order to simplify full exposure of the photoresist.

In a further method step F), the photoresist is developed, wherein the photoresist is removed at least from a radiation passage surface of the semiconductor chip.

The developing of the photoresist advantageously takes place with a developer solution, which is applied to the photoresist and strips areas of the photoresist exposed in method step D) (in the case of a positive resist) or unexposed areas of the photoresist (in the case of a negative resist) from the carrier. The developing can take place e.g. by aqueous-alkaline means using a TMAH solution, which can have a concentration of e.g. 2.38%, by drip application (puddle development). It is possible here that the TMAH solution is dripped on multiple times. In other words, the TMAH solution is renewed multiple times. Between the dripping operations, the dripped TMAH solution remains on the photoresist for a period that can be predetermined and is removed from the photoresist before the subsequent dripping operation. In this case, the drip application of the TMAH solution generally takes place so often and/or the TMAH solution remains on the photoresist between the dripping operations for so long that the exposed or unexposed areas of the photoresist are completely removed. For example, the TMAH solution is dripped on to the photoresist 10 times, with the TMAH solution remaining on the photoresist between dripping operations for a period of e.g. 10 s each time (so-called puddle development with 10×10 s). Before further TMAH solution is dripped on, the previously applied TMAH solution can be removed e.g. centrifugally. Other etching systems can also be employed advantageously for developing.

In this way, simple patterning of the photoresist can be achieved. The photoresist surrounds the radiation passage surface of the semiconductor chip laterally here as an electrically insulating layer. The patterned photoresist advantageously has a passivating effect on the semiconductor chip and acts as an electrical insulation for lateral surfaces of the semiconductor chip.

In a further method step G), a curing of the photoresist takes place with a baking step.

A further baking step advantageously takes place in order to make the patterned and developed photoresist even more resistant and harder. In this case, heating advantageously takes place, e.g. in a forced air oven, to a temperature of at least 200° C. for a period of at least 30 minutes. As a result of this baking step, the photoresist becomes highly resistant to exposure to high temperatures, for instance during operation of the semiconductor chip, and to irradiation with high-energy radiation, such as UV radiation or light in the blue wavelength range. A photoresist produced in this way remains in the semiconductor component permanently (permanent resist) and has the effect of passivating the semiconductor chip and electrically insulating it from the side, advantageously over the entire lifespan of the semiconductor component. In this case, the occurrence of signs of ageing in the photoresist, such as discolorations or brittleness, is slowed by up to eight times.

In a further method step H), an electrically conductive contact layer is applied to the photoresist in such a way that the electrically conductive contact layer is in places at a distance from a marginal surface of the photoresist facing the semiconductor chip, wherein the marginal surface facing the semiconductor chip is exposed in places.

An electrically conductive contact layer cannot create any electrical short circuits on marginal surfaces of the semiconductor chip owing to its distance from a marginal surface of the photoresist. Thus, electrical short circuits on layers of the semiconductor chip or on lateral surfaces of the semiconductor chip can advantageously be prevented in the component. Only at contact points of the semiconductor chip, which are provided for the electrical bonding of the semiconductor chip, can the electrically conductive contact layer advantageously be taken up to the semiconductor chip. In this way, application of an electrically conductive contact layer, e.g. a metallized layer, to the carrier can be ensured without the risk of short circuits in the semiconductor chip. The metallized layer comprises e.g. gold.

According to at least one embodiment of the method, after method step C) and before method step D) a method step C1) takes place, wherein a further application of the photoresist takes place according to method step B).

In this way, the photoresist on the carrier can advantageously be of multi-layer configuration in order to achieve greater film thicknesses of the photoresist on the carrier. In particular, a multi-layer arrangement of the photoresist is advantageously used if film thicknesses of the photoresist of more than 15 µm are to be achieved. In this case, a further layer of photoresist can be applied to a layer of photoresist that has already been applied and advantageously baked in accordance with method step C). The application of the photoresist again advantageously takes place according to method step B) over the entire surface of the carrier and of the photoresist that has already been applied, e.g. by means of spin coating.

According to at least one embodiment of the method, the photoresist is applied in method step C1) in a total thickness of at least 25 µm.

The photoresist can in particular be formed in multiple layers and the total thickness of the layers of the photoresist applied to the carrier can be 25 µm or more.

According to at least one embodiment of the method, after method step D) and before method step F) a further method step E) is carried out, in which the photoresist is polymerized with a baking step. This method step E) is only necessary when a negative resist is used. When a positive resist is used, polymerization by means of a further baking step can be omitted.

The further baking step (post-exposure bake) advantageously comprises heating the photoresist e.g. according to method step C). This brings about further curing of the photoresist.

According to at least one embodiment of the method, after method step C1) and before method step D) a further curing of the photoresist takes place according to method step C).

The further layer of the photoresist can advantageously be cured according to method step C). Alternatively, another type of curing can also be used advantageously to achieve other hardness properties of the photoresist.

It is also possible to configure the photoresist to consist of more than two layers, advantageously by repeating method steps B) and C) the appropriate number of times.

According to at least one embodiment of the method, after method step F) a method step F1) takes place, wherein photocuring of the photoresist takes place with UV light.

In addition, in order to make the developed photoresist after method step F) particularly resistant to exposure to UV light, light of a blue wavelength or advantageously to energetic radiation in general and to exposure to high temperatures, after method step F) a curing of the photoresist by means of UV radiation can advantageously take place. The photocuring by means of UV light in method step F1) can take place e.g. as broadband exposure in this case. To this end, the photoresist advantageously exhibits broadband sensitivity.

According to at least one embodiment of the method, the photocuring of the photoresist takes place with an illuminance of the UV light of at least 2000 mJ/cm$^2$.

This illuminance gives rise to particularly high resistance of the photoresist to degradation by UV light in the semiconductor component.

According to at least one embodiment of the method, a polymerization of the photoresist takes place by means of a baking step after method step F1).

The photoresist can advantageously be baked after method step F1) at a temperature of e.g. at least 120° C. and for a period of preferably at least 180 s in order to achieve at least partial polymerization of the photoresist.

According to at least one embodiment of the method, method step G) takes place for at least 30 minutes at a temperature of at least 200° C. The temperature given corresponds to the temperature of the oven used for the baking step here.

A final baking of the photoresist at a high temperature, advantageously of more than 200° C., increases resistance to solvents and other substances. Subsequently, therefore, any lift-off processes on the semiconductor component can advantageously have little or no effect on the photoresist.

According to at least one embodiment of the method, a photoresist is used which is a dielectric negative resist comprising a cresol resin with a melamine cross-linker or consisting of a cresol resin with a melamine cross-linker.

The use of a cross-linker proves advantageous through a better ability to affect resin polymerization in terms of stability of the photoresist during exposure and baking steps. For example, the negative resist AZ15nXT from the manufacturer AZ Chemicals, which is originally marketed as a plating resist, is particularly suitable for forming a photoresist by method steps B) to G). Although, according to the manufacturer, this negative resist is not specified as a dielectric insulating and passivating material which is intended to remain in the semiconductor component permanently, however, after processing by method steps B) to G) it proves extremely stable to UV and to high and low temperatures and exhibits much slower ageing behavior compared with common passivation materials, advantageously up to eight times slower. This negative resist has particularly high thermal dimensional stability of up to 250° C. This enables this negative resist to be used e.g. as a mask layer in a dry etching process. After method step G), the negative resist additionally has very high solvent resistance. As a result, the negative resist can be used e.g. as a so-called "permanent resist" and can, for example, withstand a further coating process without being destroyed. Furthermore, because of its high solvent resistance, the negative resist can also be used for metal lift-off methods which in particular comprise the use of high pressure and solvent baths.

Furthermore, the negative resist exhibits particularly good adhesion to various carrier materials, such as for instance $SiO_2$, SiN and different metallizings and encapsulating materials. It is advantageously possible in this case to dispense with additional adhesion promoters.

In particular as a result of an advantageous light curing by means of UV light in method step F1), extended crosslinking of the photoresist is obtained. It has been shown that the photocuring from method step F1) makes the negative resist particularly resistant to signs of ageing of the semiconductor component and that, as a result, the negative resist is even more suitable as dielectric passivation of the semiconductor chip remaining permanently in [the] semiconductor component. The photocuring by means of UV light in method step F1) can take place here e.g. as broadband exposure if the photoresist advantageously exhibits broadband sensitivity. Sufficiently high temperatures (greater than 140° C.) increase the thermal crosslinking of the resin and thus advantageously the resistance to solvents, to which the photoresist can be exposed in any further method steps.

According to at least one embodiment of the method, a photoresist is used which is a dielectric positive resist. In this case, the photoresist comprises a novolac resin or consists of a novolac resin. For example, the positive resist AZ4562 from the manufacturer AZ Chemicals is suitable as a photoresist. If a positive resist is used, the polymerization of the photoresist in a method step E) can be omitted.

According to at least one embodiment of the method, in method step D) and in method step F) marginal surfaces of the photoresist are designed such that they run obliquely relative to the top side of the carrier.

An advantageous embodiment of oblique marginal surfaces of the photoresist can be achieved by a suitable exposure method. Proximity exposure is particularly suitable for this purpose, wherein a distance exists between mask and photoresist during the exposure. As a result of said distance, an oblique incidence of light on to the photoresist relative to the surface of the carrier and of the photoresist can advantageously be achieved from the margins of the openings in the mask.

After developing, the oblique marginal surfaces of the photoresist advantageously facilitate the application of further layers, such as for instance metallizations, to the developed photoresist and the overmolding of the photoresist. Preferably, the oblique marginal surfaces form an angle of no more than 45°, particularly preferably no more than 30°, with the top side of the carrier. This oblique shape facilitates the complete overmolding of the photoresist with subsequently applied further layers.

According to at least one embodiment of the method, method steps A) to H) take place with a plurality of semiconductor chips in a wafer composite, wherein after method step H) the wafer is singulated into individual components.

By singulation into individual semiconductor components, a plurality of semiconductor components can advantageously be produced simultaneously by a small number of method steps. In this case, a semiconductor component comprises at least one semiconductor chip.

According to at least one embodiment of the optoelectronic semiconductor component, this comprises a carrier having a top side, at least one semiconductor chip on the carrier, an electrically insulating photoresist, which is arranged on the top side of the carrier, wherein at least one radiation passage surface of the semiconductor chip is free from the photoresist, and an electrically conductive contact layer, which is arranged on the photoresist, wherein the electrically conductive contact layer is in places at a distance from a marginal surface of the photoresist which faces the semiconductor chip, wherein the marginal surface facing the semiconductor chip is exposed in places and is hit by radiation emitted during operation of the semiconductor chip. The arrangement of the semiconductor chip "on the carrier" can mean here and below that the semiconductor chip is arranged in the carrier or on top of the carrier.

The photoresist is covered in places in the semiconductor component by an electrically conductive contact layer, wherein the photoresist remains permanently present in the semiconductor component. The application and forming of the photoresist advantageously take place in this case by the method steps B) to G) described in the method for the production of the semiconductor component described. The photoresist in this case exhibits high UV and temperature stability for the operation of the semiconductor chip.

The semiconductor component can, for example, be designed in a space-saving manner as a chip size package, wherein the semiconductor chip is surrounded laterally, advantageously encapsulated, by a carrier material. Alternatively, the semiconductor chip can also be arranged on a top side of the carrier.

An electrically conductive contact layer cannot create any electrical short circuits on marginal surfaces of the semiconductor chip owing to its distance from a marginal surface of the photoresist.

Owing to the fact that, in places, a marginal surface facing the semiconductor chip is exposed, radiation emitted by the semiconductor chip hits the photoresist. Areas of the photoresist which face the semiconductor chip and which can be hit by radiation emitted by the semiconductor chip are advantageously not covered by further materials, such as electrically conductive contact layers, metallizations or other materials that can cause an electrical short circuit with the semiconductor chip. This form of the photoresist advantageously effects an electrical insulation of marginal areas of the semiconductor chip with respect to electrically conductive contact layers with which the photoresist is overmoulded in places.

As a result of the high UV and temperature stability of the photoresist, the semiconductor component in this case advantageously undergoes greatly reduced ageing. This is particularly advantageous in semiconductor chips which emit UV light or light in the blue wavelength range.

According to at least one embodiment of the optoelectronic semiconductor component, the photoresist and the electrically conductive contact layer arranged thereon extend over an electrical contact surface of the semiconductor chip, partially covering this, wherein the electrically conductive contact layer is in contact with the electrical contact surface at least in places.

The semiconductor chip has at least one contact surface, advantageously in a marginal area, for electrical bonding. The photoresist is in places at a distance from this contact surface as a result of the production of the semiconductor component, and therefore an exposed area of the contact surface is present. An electrically conductive contact layer arranged on the photoresist advantageously coats the photoresist in the region over the contact surface of the semiconductor chip. On the contact surface in this case, the electrically conductive contact layer is not at a distance from a marginal surface of the photoresist in places. At this point, the contact layer coats the marginal surface of the photoresist and advantageously covers the contact surface of the semiconductor chip in places, as a result of which an electrical contact is created. In this way, by means of a single method step in which the electrically conductive contact layer is arranged in the semiconductor component, a bonding of the semiconductor chip is achieved.

According to at least one embodiment of the optoelectronic semiconductor component, this comprises an ESD protection diode and at least one via through the carrier, wherein the ESD protection diode and the via are in contact with the electrically conductive contact layer.

An ESD protection diode can advantageously be arranged on the carrier and can likewise be coated by the electrically conductive contact layer. A via through the carrier can advantageously extend through the photoresist and can make electrical contact with the electrically conductive contact layer from a bottom side of the carrier opposite to the top side of the carrier.

According to at least one embodiment of the optoelectronic semiconductor component, the photoresist is a dielectric negative resist which comprises a cresol resin with a melamine cross-linker or consists of a cresol resin with a melamine cross-linker.

For example, the negative resist AZ15nXT from the manufacturer AZ Chemicals, which is originally marketed as a plating resist, is particularly suitable for use as a photoresist. Although, according to the manufacturer, this negative resist is not specified as a dielectric insulating and passivating material which is intended to remain in the semiconductor component permanently, however, after processing by method steps B) to G) it proves extremely stable to UV and to high and low temperatures and exhibits much slower ageing behavior, advantageously up to eight times slower than common passivation materials. This negative resist has particularly high thermal dimensional stability of up to 250° C. and after method step G) it additionally has very high solvent resistance with the advantages already described.

Furthermore, the negative resist exhibits particularly good adhesion to various carrier materials, such as for instance $SiO_2$, SiN and different metallizations and encapsulating materials, wherein additional adhesion promoters can advantageously be omitted here.

It has been shown that the photocuring from method step F1) makes the negative resist particularly resistant to signs of ageing of the semiconductor component and that, as a result, the negative resist is even more suitable as a dielectric passivation of the semiconductor chip to remain permanently in the semiconductor component. Sufficiently high temperatures (greater than 140° C.) increase the thermal crosslinking of the resin and thus, advantageously, its resistance to solvents. The negative resist AZ15nXT is advantageously impaired by the radiation of the semiconductor chip to a considerably reduced extent compared with conventional photoresists, e.g. photoresists without resins and without cross-linkers, on exposed surfaces.

According to at least one embodiment of the optoelectronic semiconductor component, the photoresist is a dielectric positive resist, which comprises a novolac resin or consists of a novolac resin.

According to at least one embodiment of the optoelectronic semiconductor component, the semiconductor chip is at least partially embedded in the carrier and the radiation passage surface is flush with the top side of the carrier or protrudes above this in a vertical direction on the carrier.

The semiconductor chip can advantageously be embedded by the carrier, e.g. encapsulated by the carrier material. As a result, a particularly compact, thin and simple construction of the semiconductor component can be achieved.

Figure 2:
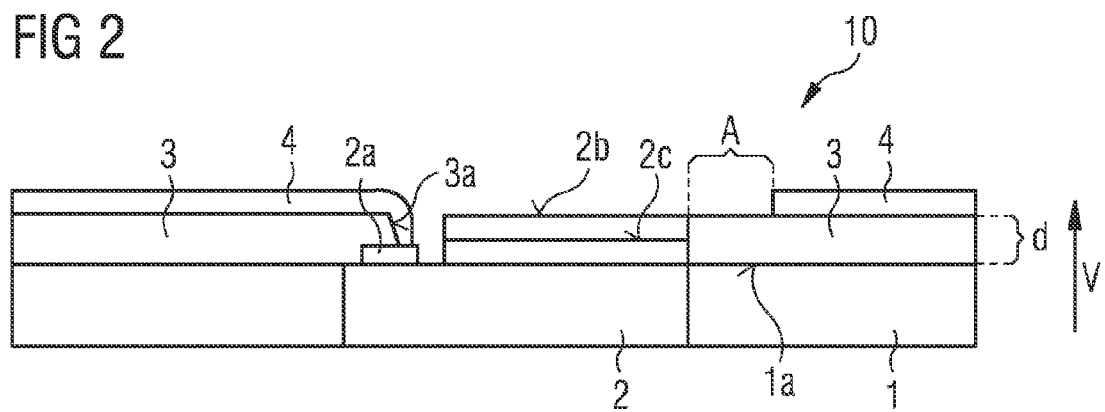
Figure 3A:
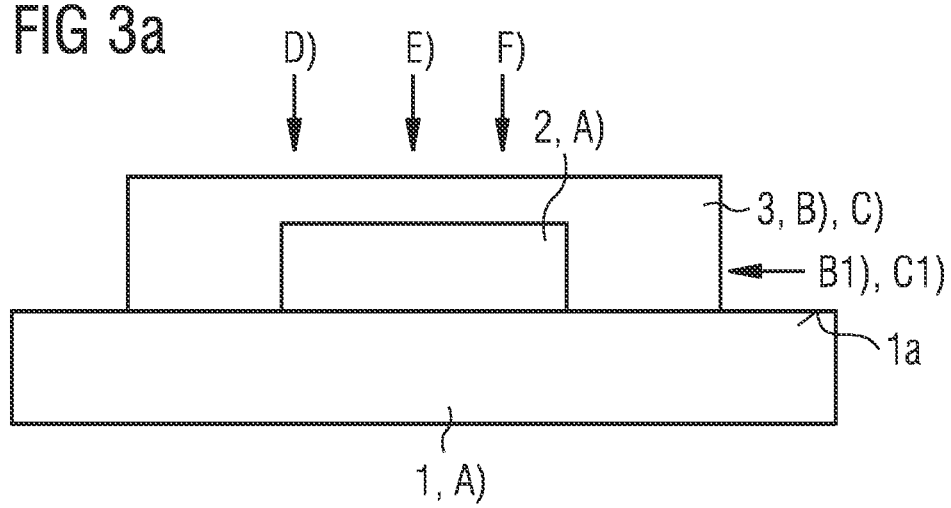
Figure 3B:
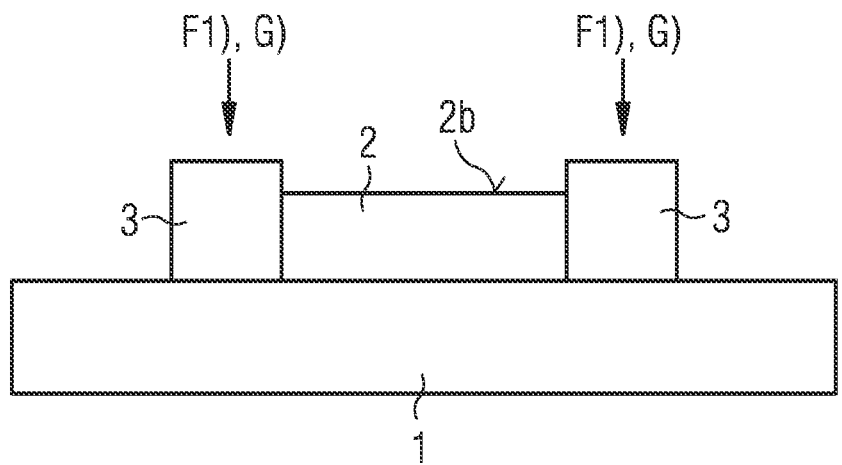
Figure 3C:
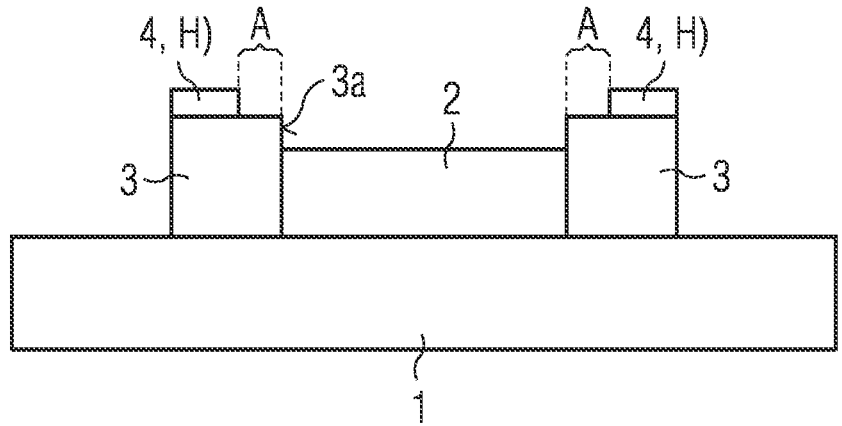

Further advantages, advantageous embodiments and developments can be taken from the exemplary embodiment described below in conjunction with the figures. These show the following:

FIG. 1: an optoelectronic semiconductor component according to an exemplary embodiment, FIG. 2: a cross-section through the optoelectronic semiconductor component, and FIGS. 3a, 3b and 3c: the production of an optoelectronic semiconductor component in a cross-sectional diagram.

Identical elements or elements having the same effect are provided with the same reference numbers in each of the figures. The components illustrated in the figures and the size ratios of the components to one another should not be considered as being to scale.

FIG. 1 shows a view of an optoelectronic semiconductor component 10. A semiconductor chip 2 is arranged on a carrier 1, wherein the carrier 1 completely surrounds the semiconductor chip 2 laterally and at least partially embeds this on its lateral surfaces. On the top side 1a of the carrier 1, a photoresist 3 is advantageously applied, covering the surface. The photoresist 3 is advantageously a dielectric and electrically insulating photoresist, in particular a negative resist. The photoresist 3 here is advantageously flush with the sides of the semiconductor chip 2, as a result of which an electrical insulation of lateral surfaces of the semiconductor chip 2 is achieved.

The semiconductor chip 2 comprises a radiation passage surface 2b, which is free from the photoresist 3. Furthermore, the semiconductor chip 2 comprises an electrical contact surface 2a in a corner region for electrical bonding purposes, wherein the photoresist 3 partially extends over the contact surface 2a.

An electrically conductive contact layer 4 partially covers the photoresist 3 and in the region of the contact surface 2a it extends over the photoresist 3 as far as the contact surface 2a. Outside the corner region with the electrical contact surface 2a, the electrically conductive contact layer 4 arranged on the photoresist 3 exhibits a distance A between the electrically conductive contact layer 4 and the semiconductor chip 2. As a result, an electrical short circuit between the contact layer 4 and lateral surfaces of the semiconductor chip 2 can advantageously be prevented.

Furthermore, the carrier 1 comprises a via 9 through the carrier, which from the top side 1 enables electrical connection of the contact layer 4 from a bottom side of the carrier opposite to the top side. The via 9 also extends through the photoresist 3 here.

Furthermore, an ESD protection diode 8 is arranged on the carrier 1. This can be integrated into the carrier 1 or arranged on a surface 1a of the carrier. The ESD protection diode 8 here is also in contact with the contact layer 4 and is covered thereby.

A production of the optoelectronic semiconductor component 10 takes place by the method steps A) to H).

The semiconductor component 10 can advantageously be produced simultaneously in a plurality here in a wafer composite, wherein after completion, the wafer composite is singulated into individual semiconductor components 10.

FIG. 2 shows a cross-section through the optoelectronic semiconductor component 10 along a line through a contact surface 2a of the semiconductor chip 2. A carrier 1 surrounds a semiconductor chip 2 laterally and partially embeds it. The carrier comprises e.g. an encapsulating material, which is cured after the encapsulation of the semiconductor chip 2. The semiconductor chip 2 comprises a radiation passage surface 2b and an active layer 2c for generating electromagnetic radiation. At a side region, the semiconductor chip 2 comprises an electrical contact surface 2a for the bonding of semiconductor layers of the semiconductor chip. On a top side 1a of the carrier 1, a photoresist 3 is arranged, which extends with a marginal surface 3a up to a lateral surface of the semiconductor chip 2. The photoresist is advantageously of multi-layer configuration and has a total thickness d of at least 25 μm. At the side region of the semiconductor chip 2 with the electrical contact surface 2a, the photoresist 3 only partially covers the contact surface 2a, wherein an electrically conductive contact layer 4 is arranged on the photoresist 3 and extends over the photoresist in the region of the contact surface 2a up to the contact surface 2a and is in electrical contact therewith. The photoresist 3 can be configured such that a marginal surface 3a runs obliquely on the top side of the carrier 1 or contact surface 2a, which advantageously facilitates an overmolding of the photoresist 3 and the marginal surface 3a.

On the lateral surface of the semiconductor chip which is in direct contact with the photoresist 3, the electrically conductive contact layer 4 arranged on the photoresist 3 exhibits a distance A between the electrically conductive contact layer 4 and the semiconductor chip 2.

Because a marginal surface 3a facing the semiconductor chip 2 is exposed in places, radiation emitted by the semiconductor chip 2 hits the photoresist 3. Areas of the photoresist 3 which face the semiconductor chip 2 and which can be hit by radiation emitted by the semiconductor chip 2 are advantageously not covered by the electrically conductive contact layer 4 in the distance A around the semiconductor chip 2, as a result of which an electrical short circuit with the semiconductor chip 2 can advantageously be prevented. Such a form of the photoresist 3 advantageously brings about an electrical insulation of marginal regions of the semiconductor chip with respect to electrically conductive contact layers 4 with which the photoresist 3 is overmolded in places.

The radiation passage surface 2b protrudes above the top side 1a of the carrier 1 in a vertical direction V on the carrier 1. Alternatively, the radiation passage surface 2b can be flush with the top side 1a of the carrier 1.

Because of the high UV and temperature stability of the photoresist 3, the semiconductor component 10 advantageously undergoes greatly reduced ageing. This is particularly advantageous in the semiconductor chips 2 that emit UV light or light in the blue wavelength range.

FIG. 3a shows method steps in the production of an optoelectronic semiconductor component according to the method in a cross-sectional diagram. A carrier 1 with a top side 1a is prepared in method step A). Then, in a method step A), a semiconductor chip 2 is arranged on the carrier, e.g. on a surface 1a. Furthermore, an electrically insulating photoresist 3 is applied to the top side 1a and to the semiconductor chip 2 by method step B). Subsequently, the photoresist 3 is cured in a further method step C). Steps B) and C) may optionally take place multiple times in succession as method steps B1) and C1) in order to achieve an appropriate total thickness d of the photoresist.

Then, the photoresist 3 is patterned by exposure in a method step D) and polymerized in a method step E). This is followed by developing the photoresist 3 in a method step F).

FIG. 3b shows the photoresist 3 after method step F), after which a radiation passage surface 2b is free from photoresist 3. Then, a method step G) is carried out for curing the photoresist by heating. After method step F) and before method step G), a further method step F1) may optionally take place, wherein a photocuring of the photoresist 3 with UV light takes place.

FIG. 3c shows the photoresist 3 after method step G) and after a further method step H), wherein an electrically conductive contact layer 4 is applied to the photoresist 3, wherein the electrically conductive contact layer 4 is in places at a distance from a marginal surface 3a of the photoresist 3 which faces the semiconductor chip 2, wherein the marginal surface 3a facing the semiconductor chip 2 is exposed in places.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

The invention claimed is:

1. A method for producing an optoelectronic semiconductor component comprising the following steps in the given sequence:
    A) arranging at least one semiconductor chip on a carrier,
    B) applying an electrically insulating photoresist to a top side of the carrier and to the semiconductor chip,
    C) curing the photoresist with a baking step,
    D) patterning the photoresist by exposure,
    F) developing the photoresist, wherein the photoresist is removed at least from a radiation passage surface of the semiconductor chip,
    G) further curing the photoresist with a baking step with a final baking of the photoresist at a temperature of at least 200° C., which is higher than a temperature during step C), and
    H) applying an electrically conductive contact layer to the photoresist,
    wherein the electrically conductive contact layer is in places at a distance from a marginal surface of the photoresist which faces the semiconductor chip, wherein the marginal surface facing the semiconductor chip is exposed in places.

2. The method for producing an optoelectronic semiconductor component according to claim 1,
    in which after step C) and before step D) a step C1) is carried out, wherein a further application of the photoresist takes place according to step B).

3. The method for producing an optoelectronic semiconductor component according to claim 2,
    in which the photoresist is applied in a total thickness of at least 25 μm.

4. The method for producing an optoelectronic semiconductor component according to claim 2,
  in which after step C1) and before step D) a further curing of the photoresist takes place according to step C).

5. The method for producing an optoelectronic semiconductor component) according to claim 1,
  in which after step D) and before step F) a further method step E) is carried out, in which the photoresist is polymerized with a baking step.

6. The method for producing an optoelectronic semiconductor component according to claim 1,
  in which after step F) a step F1) is performed, wherein a photocuring of the photoresist takes place with UV light.

7. The method for producing an optoelectronic semiconductor component according to claim 6,
  in which the photocuring of the photoresist takes place with an illuminance of the UV light of at least 2000 mJ/cm$^2$.

8. The method for producing an optoelectronic semiconductor component according to claim 1,
  in which after step F1) a polymerization of the photoresist takes place by a baking step.

9. The method for producing an optoelectronic semiconductor component according to claim 1,
  in which the method step G) takes place for at least 30 minutes at a temperature of at least 200° C.

10. The method for producing an optoelectronic semiconductor component according to claim 1,
  in which the photoresist is a dielectric negative resist, which comprises a cresol resin with a melamine cross-linker or consists of a cresol resin with a melamine cross-linker.

11. The method for producing an optoelectronic semiconductor component according to claim 1,
  in which the photoresist is a dielectric positive resist, which comprises a novolac resin or consists of a novolac resin.

12. The method for producing an optoelectronic semiconductor component according to claim 1,
  in which in step D) and in step F) marginal surfaces of the photoresist are configured such that they run obliquely relative to the top side of the carrier.

13. The method for producing an optoelectronic semiconductor component according to claim 1,
  in which the steps A) to H) take place with a plurality of semiconductor chips in a wafer composite, wherein after step H) the wafer is singulated into individual components.

14. The method for producing an optoelectronic semiconductor component according to claim 1,
  in which the photoresist and the electrically conductive contact layer arranged thereon extend over an electrical contact surface of the semiconductor chip, partially covering this, and the electrically conductive contact layer is in contact with the electrical contact surface at least in places.

15. The method for producing an optoelectronic semiconductor component according to claim 1, comprising
  providing an ESD protection diode, and
  forming at least one via through the carrier, wherein the ESD protection diode and the via are in electrical contact with the electrically conductive contact layer.

16. The method for producing an optoelectronic semiconductor component according to claim 1,
  in which the semiconductor chip is at least partially embedded in the carrier and the radiation passage surface is flush with the top side of the carrier or protrudes above this in a vertical direction on the carrier.

17. A method for producing an optoelectronic semiconductor component comprising the following steps in the given sequence:
  A) arranging at least one semiconductor chip on a carrier,
  B) applying an electrically insulating photoresist to a top side of the carrier and to the semiconductor chip,
  C) curing the photoresist with a baking step,
  D) patterning the photoresist by exposure,
  F) developing the photoresist, wherein the photoresist is removed at least from a radiation passage surface of the semiconductor chip,
  G) further curing the photoresist with a baking step with a final baking of the photoresist at a temperature of at least 200° C., which is higher than a temperature during step C), and
  H) applying an electrically conductive contact layer to the photoresist, wherein the electrically conductive contact layer is in places at a distance from a marginal surface of the photoresist which faces the semiconductor chip, wherein the marginal surface facing the semiconductor chip is exposed in places.

* * * * *